(12) United States Patent
Ching et al.

(10) Patent No.: US 9,147,682 B2
(45) Date of Patent: Sep. 29, 2015

(54) FIN SPACER PROTECTED SOURCE AND DRAIN REGIONS IN FINFETS

(71) Applicant: Taiwan Semiconductor Manufactoring Company, Ltd., Hsin-Chu (TW)

(72) Inventors: Kuo-Cheng Ching, Zhubei (TW); Ting-Hung Hsu, MiaoLi (TW); Chao-Hsiung Wang, Hsin-Chu (TW); Chi-Wen Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/056,649

(22) Filed: Oct. 17, 2013

(65) Prior Publication Data
US 2015/0108544 A1   Apr. 23, 2015

(51) Int. Cl.
| | |
|---|---|
| *H01L 29/66* | (2006.01) |
| *H01L 27/088* | (2006.01) |
| *H01L 21/8234* | (2006.01) |
| *H01L 29/165* | (2006.01) |
| *H01L 21/8238* | (2006.01) |

(52) U.S. Cl.
CPC .... *H01L 27/0886* (2013.01); *H01L 21/823431* (2013.01); *H01L 21/823481* (2013.01); *H01L 29/165* (2013.01); *H01L 21/823821* (2013.01)

(58) Field of Classification Search
CPC ................... H01L 27/0886; H01L 21/823431; H01L 21/823821
USPC ........... 257/365, E29.264, E29.275; 438/283, 438/157
See application file for complete search history.

(56) References Cited

U.S. PATENT DOCUMENTS

| | | | | |
|---|---|---|---|---|
| 2007/0278585 | A1* | 12/2007 | Dyer et al. | 257/369 |
| 2011/0127610 | A1* | 6/2011 | Lee et al. | 257/365 |
| 2012/0276695 | A1* | 11/2012 | Cheng et al. | 438/154 |
| 2013/0334606 | A1* | 12/2013 | Shen et al. | 257/368 |
| 2014/0131776 | A1* | 5/2014 | Ching et al. | 257/288 |
| 2014/0217517 | A1* | 8/2014 | Cai et al. | 257/401 |
| 2014/0273397 | A1* | 9/2014 | Rodder et al. | 438/400 |

\* cited by examiner

*Primary Examiner* — Kimberly Rizkallah
*Assistant Examiner* — Maria Ligai
(74) *Attorney, Agent, or Firm* — Slater & Matsil, L.L.P.

(57) ABSTRACT

An integrated circuit device includes a semiconductor substrate, insulation regions extending into the semiconductor substrate, and a semiconductor fin protruding above the insulation regions. The insulation regions include a first portion and a second portion, with the first portion and second portion on opposite sides of the semiconductor fin. The integrated circuit device further includes a gate stack on a top surface and sidewalls of the semiconductor fin, and a semiconductor region connected to an end of the semiconductor fin. The semiconductor region includes a first semiconductor region formed of a first semiconductor material, wherein the first semiconductor region comprise faceted top surfaces, and a second semiconductor region underlying the first semiconductor region. The second semiconductor region has a higher germanium concentration than the first semiconductor region. A fin spacer is on a sidewall of the second semiconductor region, wherein the fin spacer overlaps a portion of the insulation regions.

21 Claims, 11 Drawing Sheets

FIN SPACER PROTECTED SOURCE AND DRAIN REGIONS IN FINFETS

CROSS REFERENCES TO RELATED APPLICATIONS

This patent application is related to U.S. patent application Ser. No. 13/740,373, filed Jan. 14, 2013, and entitled "Semiconductor Device and Fabricating the Same,"; U.S. patent application Ser. No. 13/902,322, filed May 24, 2013, and entitled "Semiconductor Device and Method of Fabricating Same,"; U.S. patent application Ser. No. 13/934,992, filed Jul. 3, 2013, entitled "Fin Structure of Semiconductor Device,"; U.S. patent application Ser. No. 13/970,295, filed Aug. 19, 2013, entitled "FinFETs and Methods for Forming the Same,"; U.S. patent application Ser. No. 13/952,753, filed Jul. 29, 2013; U.S. patent application Ser. No. 14/024,148, filed Sep. 11, 2013, entitled "Isolation Structure of Fin Field Effect Transistor,"; U.S. patent application Ser. No. 14/090,072 filed Nov. 26, 2013.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. Although existing FinFET devices and methods of fabricating the FinFET devices have been generally adequate for their intended purposes, they have not been entirely satisfactory in all respects. Improvements in this area are desired.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A Fin Field-Effect Transistor (FinFET) and the method of forming the same are provided in accordance with various exemplary embodiments. The intermediate stages of forming the FinFET are illustrated. The variations of the embodiments are discussed. Throughout the various views and illustrative embodiments, like reference numbers are used to designate like elements.

Figure 1:
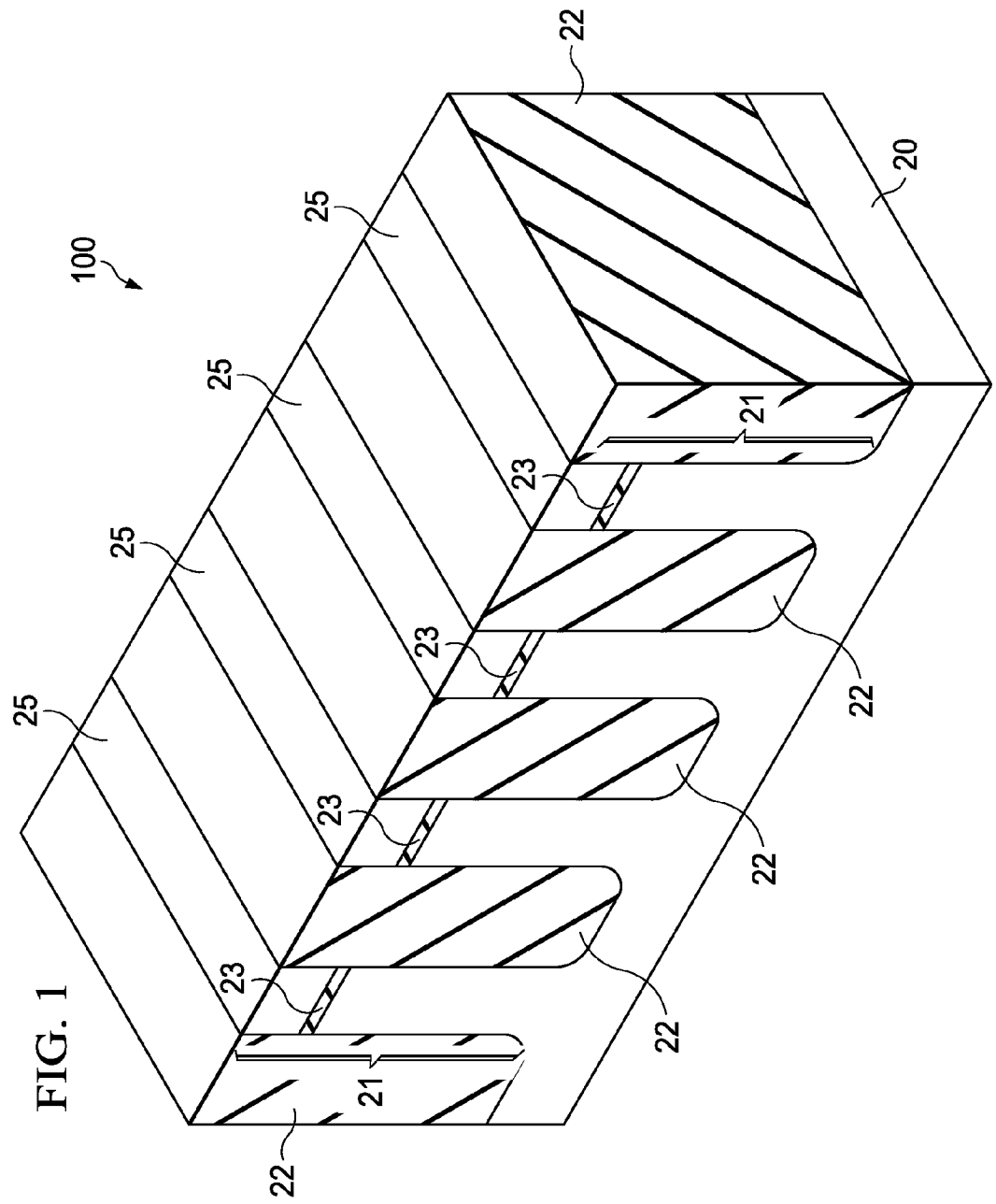
FIGS. 1 through 11 are cross-sectional views and perspective views of intermediate stages in the manufacturing of a Fin Field-Effect Transistor (FinFET) in accordance with some exemplary embodiments.

FIGS. 1 through 11 are perspective views and cross-sectional views of intermediate stages in the manufacturing of a FinFET in accordance with some exemplary embodiments. FIG. 1 illustrates a perspective view of an initial structure. The initial structure includes wafer 100, which includes substrate 20. Substrate 20 may be a semiconductor substrate, which may further be a silicon substrate. Substrate 20 may be doped with a p-type or an n-type impurity. Isolation regions such as Shallow Trench Isolation (STI) regions 22 are formed to extend from a top surface of substrate 20 into substrate 20, wherein top surface of substrate 20 is also a major surface 100A of wafer 100. The portions of substrate 20 between neighboring STI regions 22 are referred to as semiconductor strips 21. The top surfaces of STI regions 22 may be leveled with the top surfaces of hard mask layers 25, which are used as a Chemical Mechanical Polish (CMP) stop layer during the formation of STI regions 22. Pad oxide layers 23 are formed between hard mask layers 25 and semiconductor strips 21.

Figure 2:
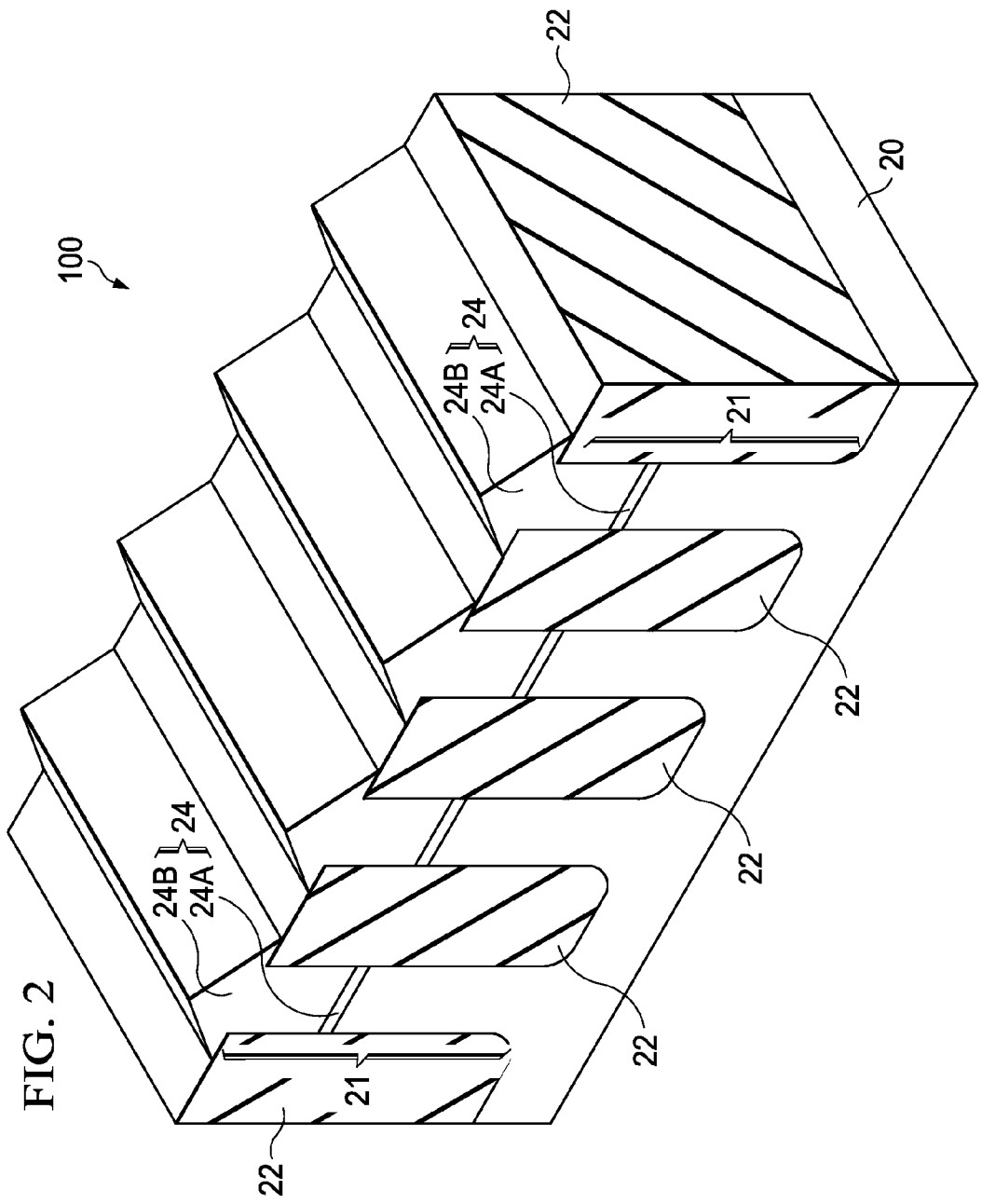

FIG. 2 illustrates the replacement of the top portion of semiconductor strips 21 in FIG. 1 with semiconductor strips 24. In the replacement of semiconductor strips 21, pad oxide layers 23 and hard mask layers 25 (FIG. 1) are removed first. At least the top portions, or substantially entireties, of semiconductor strips 21 are then removed to form recesses (not shown, occupied by semiconductor strips 24). Next, an epitaxy is performed to epitaxially grow semiconductor strips 24 in the recesses, forming the structure in FIG. 2.

The formation of semiconductor strips 24 includes depositing a semiconductor layer 24A to partially fill in the trenches, and a semiconductor layer 24B on the top of first semiconductor material 24A. The first and second semiconductor layers 24A and 24B may be deposited by epitaxial growing processes. The epitaxial processes include Chemical Vapor Deposition (CVD) techniques (e.g., Vapor-Phase Epitaxy (VPE) and/or Ultra-High Vacuum CVD (UHV-CVD)), molecular beam epitaxy, and/or other suitable processes. In some embodiments, semiconductor layer 24A is a silicon germanium (SiGe) layer, and semiconductor layer 24B is a silicon layer free from or substantially free from germanium (for example, with a germanium percentage lower than about 5 percent). Semiconductor layer 24A may have a germanium percentage in the range between about 15 percent and about 60 percent, although the germanium percentage may be higher or lower. The thickness of semiconductor layer 24A may be in the range between about 10 nm and about 40 nm.

After the formation of the structure as shown in FIG. 2, a CMP process is performed to remove excessive semiconductor layer 24B, and to planarize the top surfaces of semiconductor layer 24B and STI regions 22.

Figure 3:
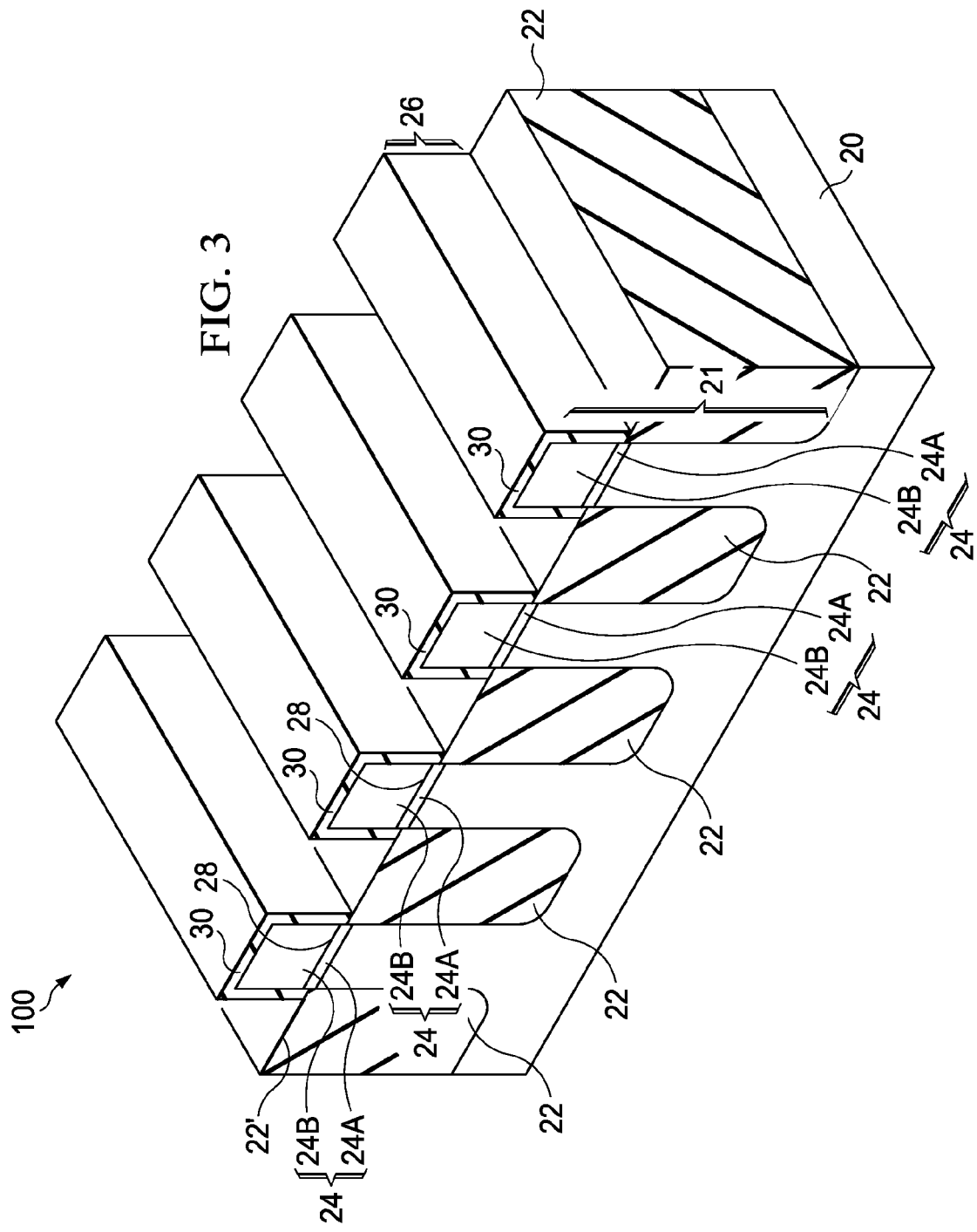

Referring to FIG. 3, STI regions 22 are recessed, so that the top portions of semiconductor strips 24 are higher than the top surfaces of STI regions 22 to form semiconductor fins 26. In accordance with some embodiments, interface 28 between semiconductor layer 24B the respective underlying semiconductor layer 24A are higher than top surface 22A' of the recessed STI regions 22. In alternative embodiments, interfaces 28 are level with or lower than top surfaces 22A'. Dummy oxide layer 30 may be formed on the sidewalls and the top surfaces of semiconductor fins 26. Dummy oxide layer 30 may be formed, for example, through deposition.

Figure 4:
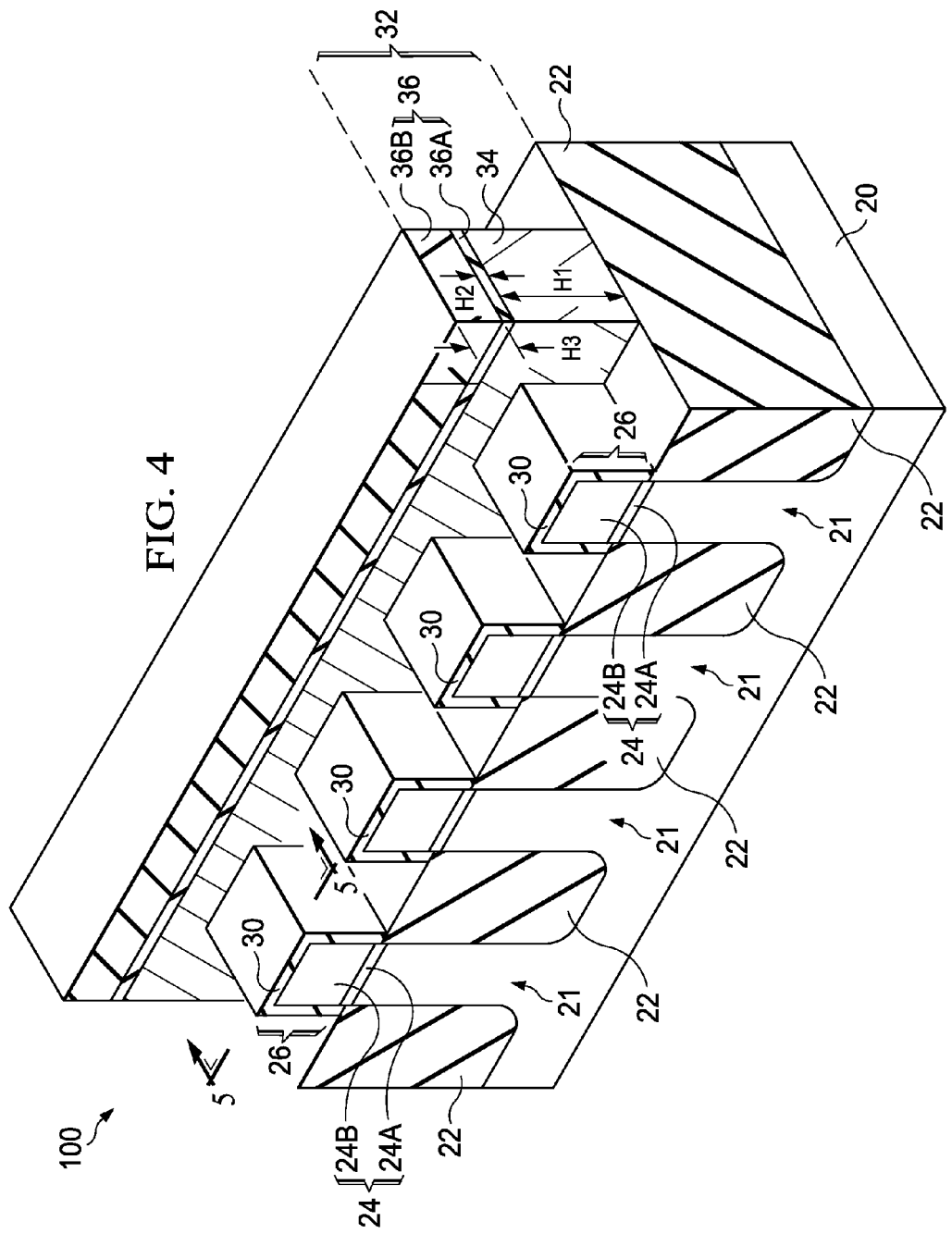

Referring to FIG. 4, gate stack 32 is formed on the top surface and the sidewalls of semiconductor fins 26. In some embodiments, gate stack 32 includes dummy gate electrode 34 over dummy dielectric 30. Dummy gate electrode 34 may be formed, for example, using polysilicon. In some embodiments, height (thickness) H1 of dummy gate electrode 34 is in the range between about 80 nm and about 120 nm. Gate stack 32 may also comprise hard mask layer 36 over dummy gate electrode 34. Hard mask layer 36 may include silicon nitride and/or silicon oxide, for example, and may be a single layer or a composite layer including a plurality of layers. In some embodiments, hard mask layer 36 includes silicon nitride layer 36A and silicon oxide layer 36B over silicon nitride layer 36A. Height H2 of silicon nitride layer 36A may be in the range between about 10 nm and about 30 nm, and height H3 of silicon oxide layer 36B may be in the range between about 80 nm and about 120 nm. Gate stack 32 may cross over a plurality of semiconductor fins 26 and STI regions 22. Gate stack 32 has a lengthwise direction substantially perpendicular to the lengthwise direction of semiconductor fins 26. In accordance with the embodiments of the present disclosure, gate stack 32 is a dummy gate stack, and will be replaced by a replacement gate in a subsequent step.

Figure 5:
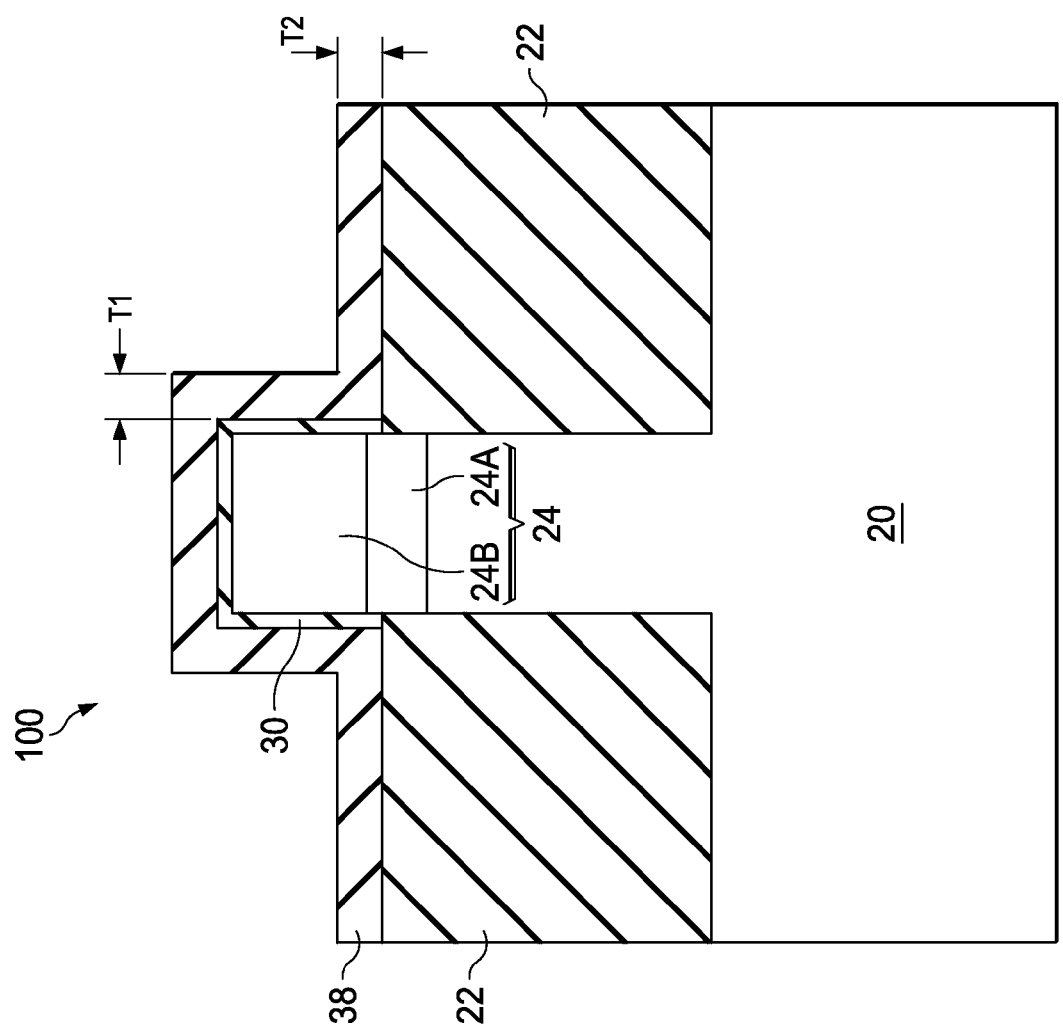
Figure 6:
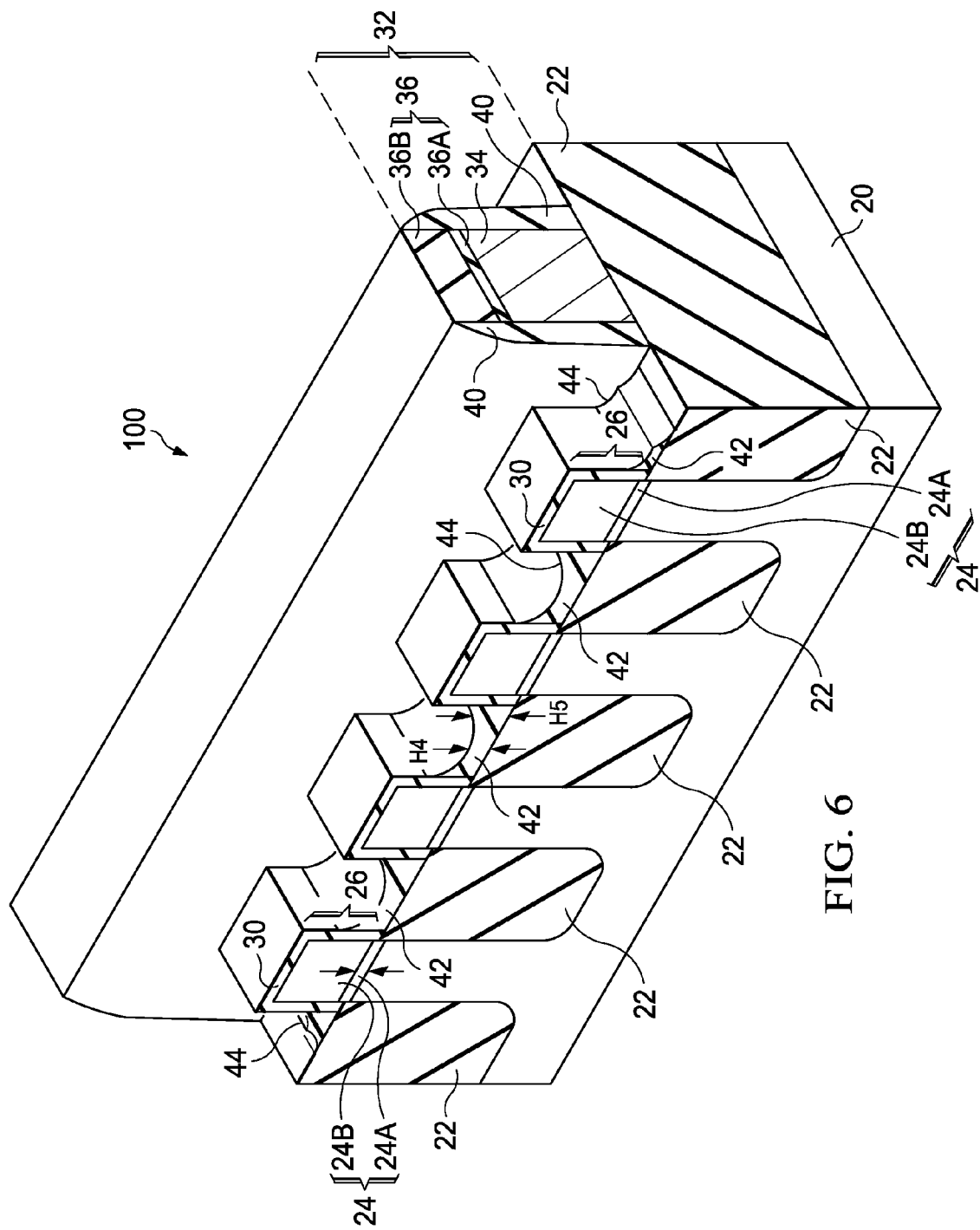

FIGS. 5 and 6 illustrate the formation of gate spacers 40 and 42. Referring to FIG. 5, spacer layer 38 is formed as a blanket layer to cover the structure shown in FIG. 4. FIG. 5 illustrates a cross-sectional view taken along a plane, which is the same plane containing line A-A in FIG. 4. In some embodiments, spacer layer 38 is formed of silicon nitride, and may have a single-layer structure. In alternative embodiments, spacer layer 38 is a composite layer including a plurality of layers. For example, spacer layer 38 may include a silicon oxide layer, and a silicon nitride layer over the silicon oxide layer. Spacer layer 38 may be formed as a substantially conformal layer, and hence thickness T1 of the vertical portions of spacer layer 38 on the sidewalls of semiconductor fin 26 and gate stack 32 is close to thickness T2 of the horizontal portion of spacer layer 38. For example, thickness T1 and T2 may have a difference smaller than about 20 percent of thickness T2.

Next, spacer layer 38 is patterned, forming gate spacers 40 and fin spacers 42, as shown in FIG. 6. In some embodiments in which spacer layer 38 (FIG. 5) includes silicon nitride, the patterning of the silicon nitride layer includes a dry etching using $CH_2F_2$ as an etchant. In other embodiments in which spacer layer 38 (FIG. 5) includes a silicon oxide layer and a silicon nitride layer, the patterning of spacer layer 38 includes a dry etching using $CH_2F_2$ as an etchant to pattern silicon nitride, followed by a dry etching using $CF_4$ as an etchant to pattern the silicon oxide layer. The patterning includes an anisotropic effect, so that the horizontal portions of spacer layer 38 are removed, while the vertical portions on the sidewalls of gate stack 32 remain to form gate spacers 40. The vertical portions of spacer layer 38 on the sidewalls of semiconductor fin 26 remain to form fin spacers 42.

The process conditions for patterning gate spacer layer 38 are controlled, so that the top ends 44 of fin spacers 42 are lower than the top surfaces of semiconductor fins 26. Furthermore, the top ends 44 are higher than the top surface of semiconductor layer 24A, which may be a silicon germanium layer. Accordingly, the sidewalls of the entire semiconductor layer 24A are protected by fin spacers 42 and STI regions 22. The resulting fin spacers 42 between two neighboring fins 26 may have a dishing-shape in the cross-sectional view, with the edge portions of fin spacers 42 being highest (with height H4), and the center portion of fin spacers 42 in the middle of neighboring fins 26 being the lowest (with height H5). In some embodiments, the center height H5 of fin spacers 42 is in the range between about 5 nm and about 15 nm. Edge height H4 may be greater than center height H5 by a difference in the range between about 2 nm and about 8 nm.

Figure 7:
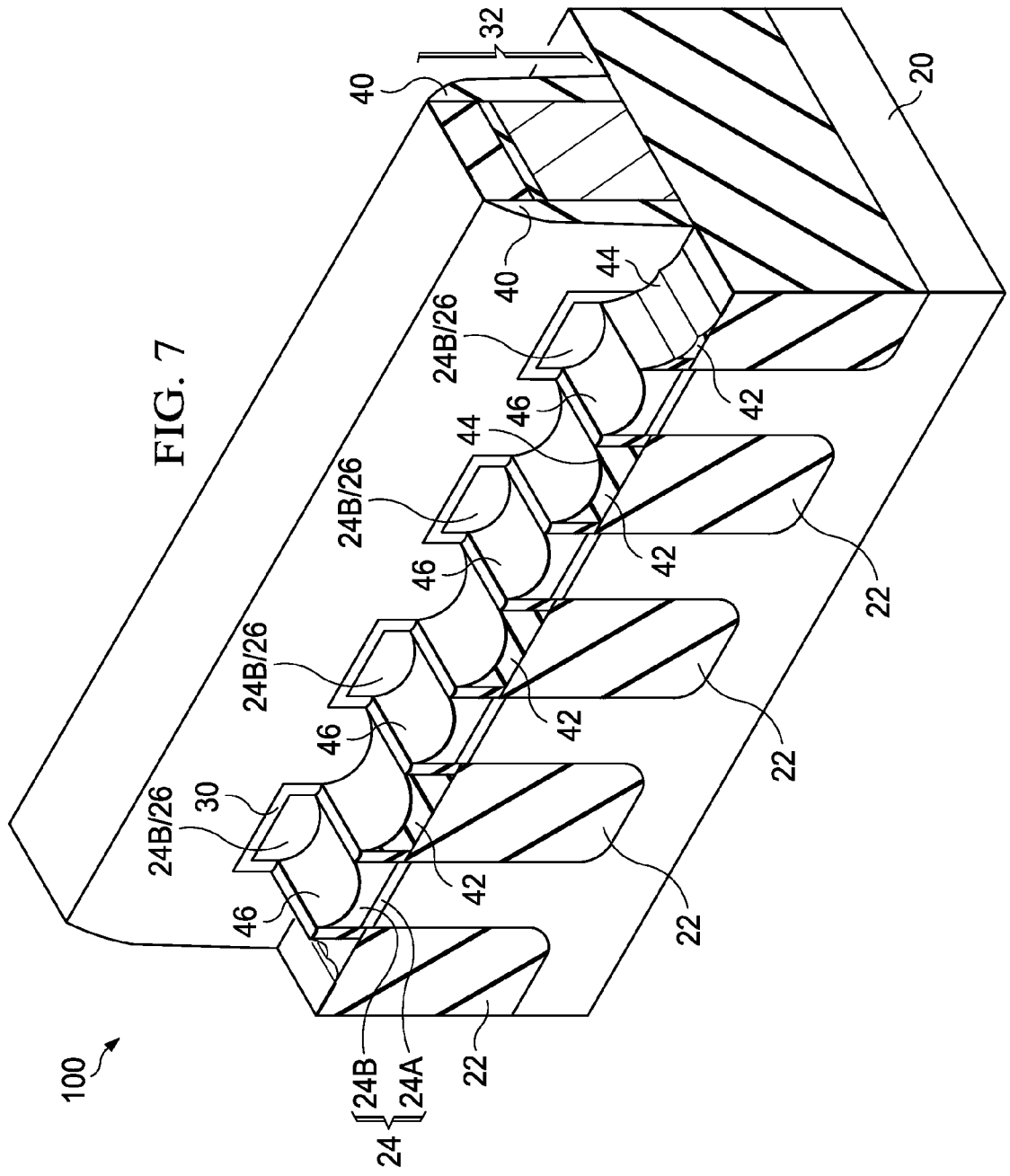

Referring to FIG. 7, the exposed portions of dummy oxide layer 30, if any, are removed through etching. An etching step is then performed to etch the portions of semiconductor strips 24 (FIG. 3) that are not covered by gate stack 32 and gate spacers 40. When the etching stops, semiconductor layers 24B, which may be silicon layers, still have the bottom portion left, with the thickness of the remaining semiconductor layers 24B being in the range between about 2 nm and about 8 nm, for example. Accordingly, semiconductor layers 24A are not exposed. In some embodiments, the top ends 44 of fin spacers 42 are higher than the top surfaces of the remaining semiconductor layers 24B, hence recesses 46 are formed between neighboring fin spacers 42.

Figure 8:
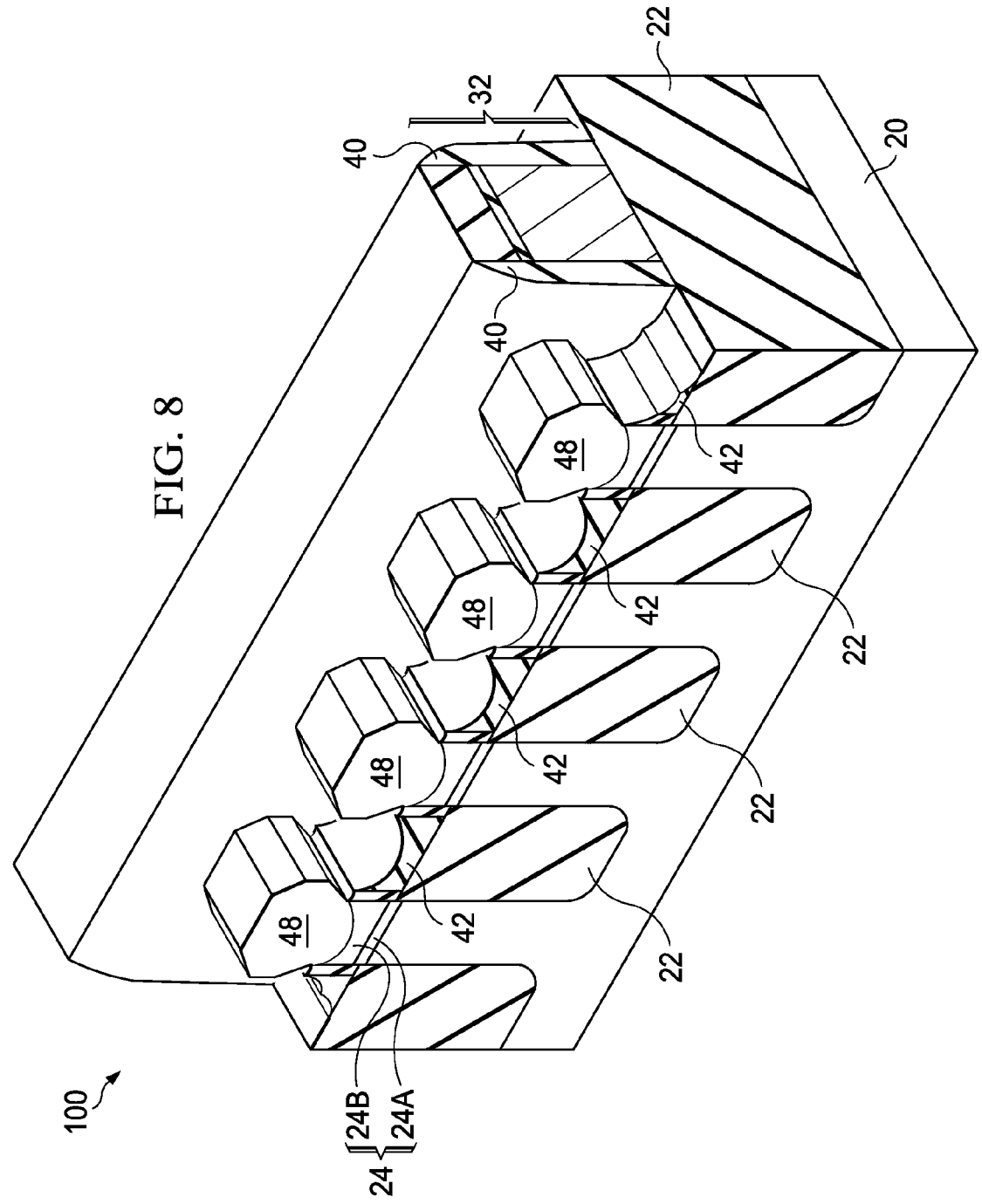

Next, referring to FIG. 8, epitaxy regions 48 are formed by selectively growing a semiconductor material from recesses 46 (FIG. 7) that are left by the removed portions of semiconductor strips 24. In some exemplary embodiments, epitaxy regions 48 comprise silicon phosphorous (SiP) or phosphorous-doped silicon carbide (SiCP). The further epitaxial growth of epitaxy regions 48 causes epitaxy regions 48 to expand horizontally, and facets start to form. As illustrated in FIG. 8, due to the blocking of fin spacers 42, epitaxy regions 48 are first grown vertically in recesses 46, during which time epitaxy regions 48 do not grow horizontally. After recesses 46 are fully filled, the subsequently grown epitaxy regions 48 are grown both vertically and horizontally. Hence, the horizontal growth is delayed.

In some embodiments, during the growth of epitaxy regions 48, an n-type impurity such as phosphorous is in-situ doped to form source and drain regions, which are also denoted using reference numeral 48. The resulting FinFET is hence an n-type FinFET.

Figure 9:
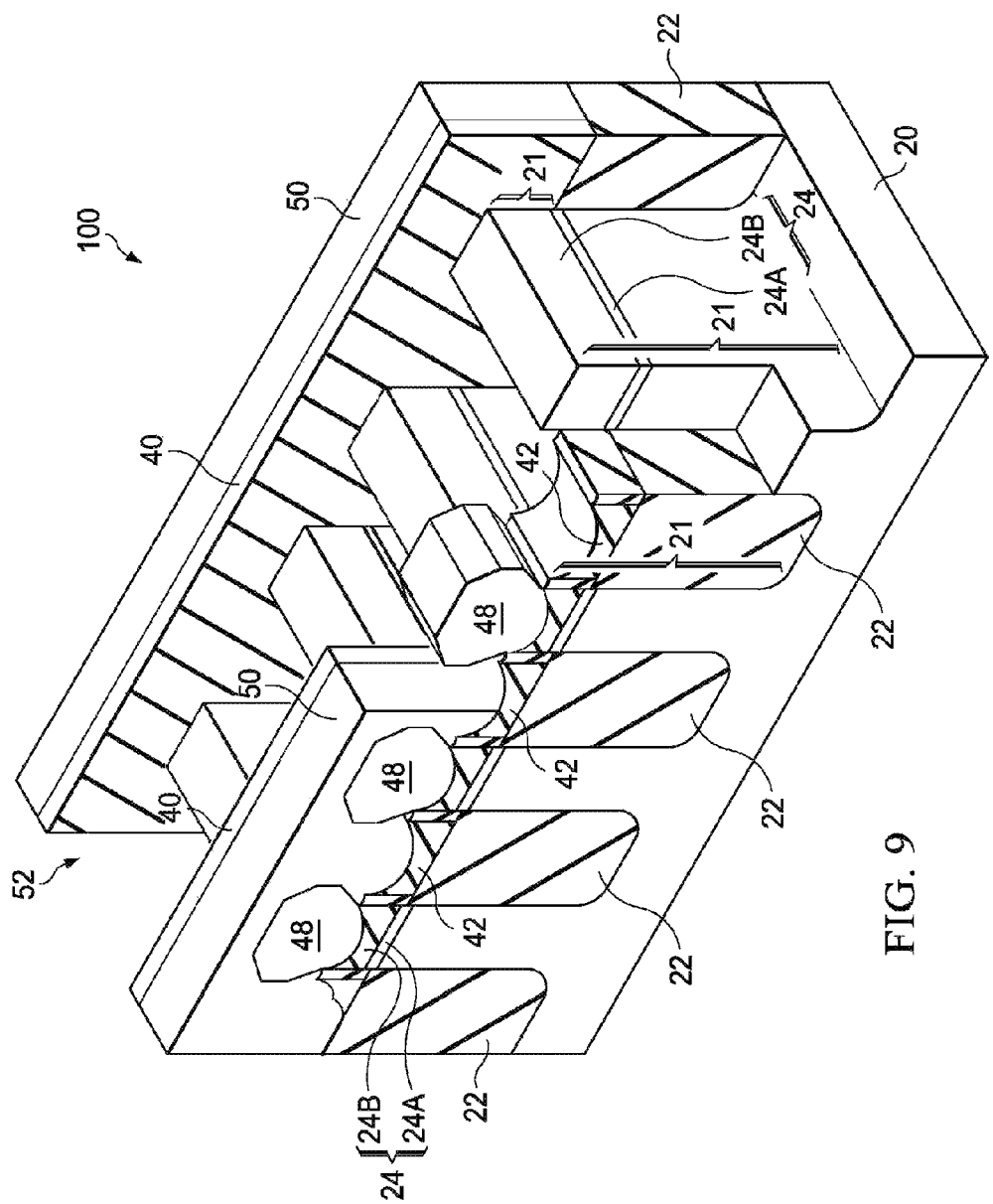

Hard mask layer 36 (shown in FIG. 8) is removed by photo patterning and dry etching processes, and top surface of dummy gate electrode 34 (FIG. 8) is exposed. Next, as shown in FIG. 9, Inter-Layer Dielectric (ILD) 50 is formed. Although not shown, a buffer oxide layer and a Contact Etch Stop Layer (CESL) may also be formed before the formation of ILD 50. ILD 50 may comprise a Flowable oxide formed using, for example Flowable Chemical Vapor Deposition (FCVD). A CMP may then be performed to level the top surfaces of ILD 50, top surface of dummy gate electrode 34 (FIG. 8), and gate spacers 40 with each other. Each of ILD 50, fin spacers 42, and insulation regions 22 may have distinguishable interfaces with the other ones of ILD 50, fin spacers 42, and insulation regions 22 since they are formed in different process steps, having different densities, and/or comprise different dielectric materials.

Next, dummy gate electrode 34 as shown in FIG. 8 is removed in an etching step, so that recess 52 is formed to extend into ILD 50, as shown in FIG. 9. To illustrate the features behind the front portion of ILD 50, some front portions of ILD 50, semiconductor strips 21, source/drain regions 48, source/drain regions 48, STI regions 22, and the like are not shown in FIGS. 9, 10, and 11, so that the inner features may be illustrated. It is appreciated that the unillustrated portions of ILD 50, semiconductor strips 21, source/drain regions 48, and STI regions 22 still exist. After the removal of dummy gate stack 32, the middle portions of semiconductor fins 26 are exposed to recess 52. During the removal of dummy gate electrode 34, dummy gate oxide 30 (FIG. 3) is used as an etch stop layer when the top layer is etched. Dummy gate oxide 30 is then removed.

Figure 10:
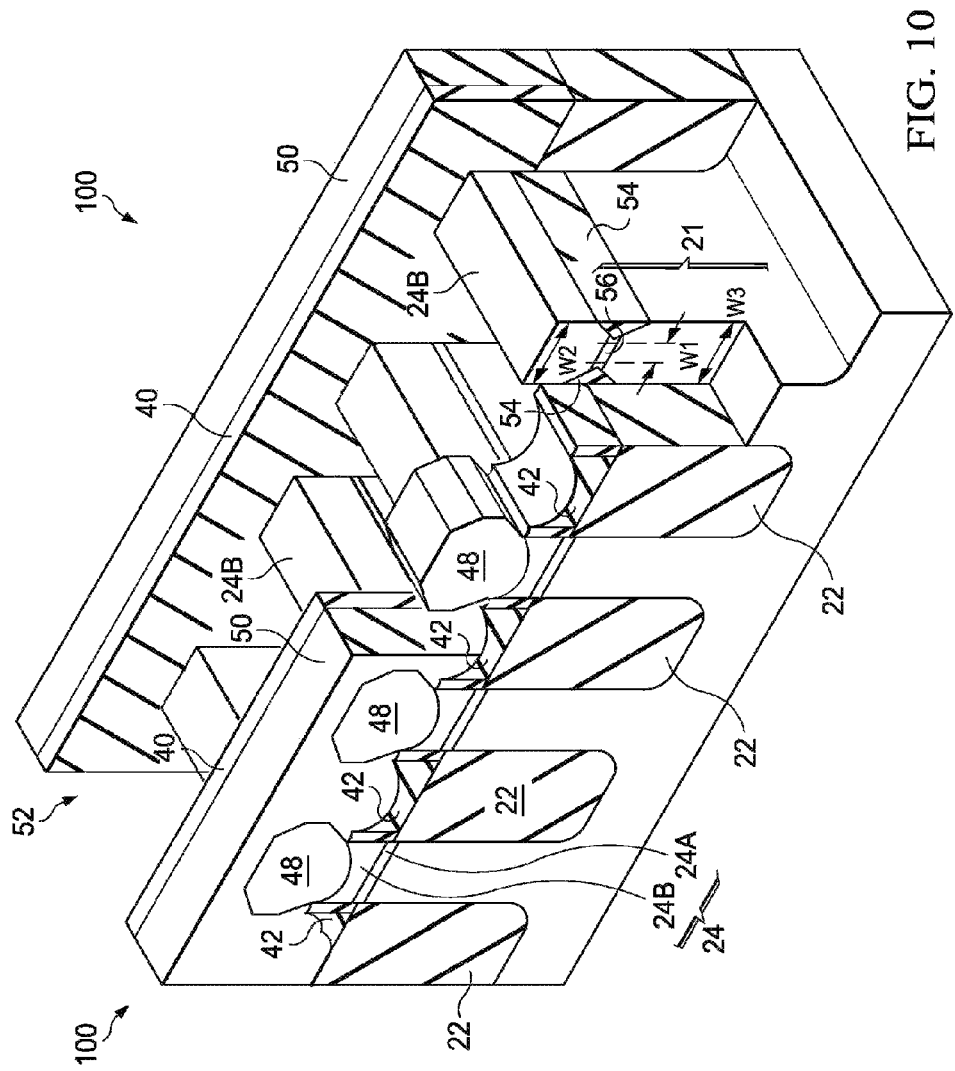

Referring to FIG. 10, a thermal oxidation process is performed on the exposed first and second semiconductor layers 24A and 24B. In some embodiments, the thermal oxidation process is conducted in an oxygen-containing ambient. In other embodiments, the thermal oxidation process is conducted in a combination of a steam ambient and an oxygen-containing ambient. During the thermal oxidation process, outer portions of semiconductor layer 24A (FIG. 7) are converted to semiconductor oxide regions 54, while some inner portion is not converted to oxide. Semiconductor oxide regions 54 may be silicon oxide regions, and include portions on opposite sides of semiconductor region 56. Semiconductor oxide regions 54 may also form a ring encircling semiconductor region 56, with the ring include a portion overlying and a portion underlying semiconductor region 56 in addition to the portions on opposite sides of semiconductor region 56.

During the thermal oxidation process, the semiconductor layer 24A obtains a volume expansion. In some embodiments, the semiconductor layers 24A and 24B and the thermal oxidation process are configured so that the semiconductor layer 24A obtains a volume expansion to achieve a desired degree of channel strain, such as 1 Gpa of tensile strain. It is realized, however, that the ratios of the volume expansion may change in different embodiments.

In some embodiments, the oxidation is performed at a temperature in the range between about 400° C. and 600° C. The oxidation time may range between about 2 minutes and about 4 hours, for example. The oxidation of silicon in silicon germanium is easier than the oxidation of germanium in the same silicon germanium region. Accordingly, the silicon atoms in semiconductor layers 24A are oxidized, and the germanium atoms in semiconductor layers 24A remain substantially un-oxidized. The germanium atoms may diffuse inwardly toward the centers of semiconductor layers 24A to form semiconductor region 56, in which germanium atoms are concentrated. Accordingly, semiconductor region 56 has a germanium percentage higher than that of semiconductor layer 24A (FIG. 9), and may possibly a pure germanium region. The germanium atoms may also diffuse to the interface regions between semiconductor layers 24A and the underlying semiconductor region 21, and the interface between semiconductor layers 24A and the overlying semiconductor layer 24B. During the oxidation, a silicon oxide layer (not shown) is formed on the top surface and the sidewalls of semiconductor layer 24B. The oxide layer may be kept, with the subsequently formed replacement gate formed on the oxide layer. The oxide layer may also be removed before the subsequent formation of the replacement gate, as shown in FIG. 11.

As a result of the oxidation, the width W1 of germanium/silicon germanium region 56 is smaller than width W2 of the underlying portion of semiconductor strip 21 and width W3 of semiconductor layer 24B. In these embodiments, region 56 may form the bottom portion of the resulting semiconductor fins 26.

Figure 11:
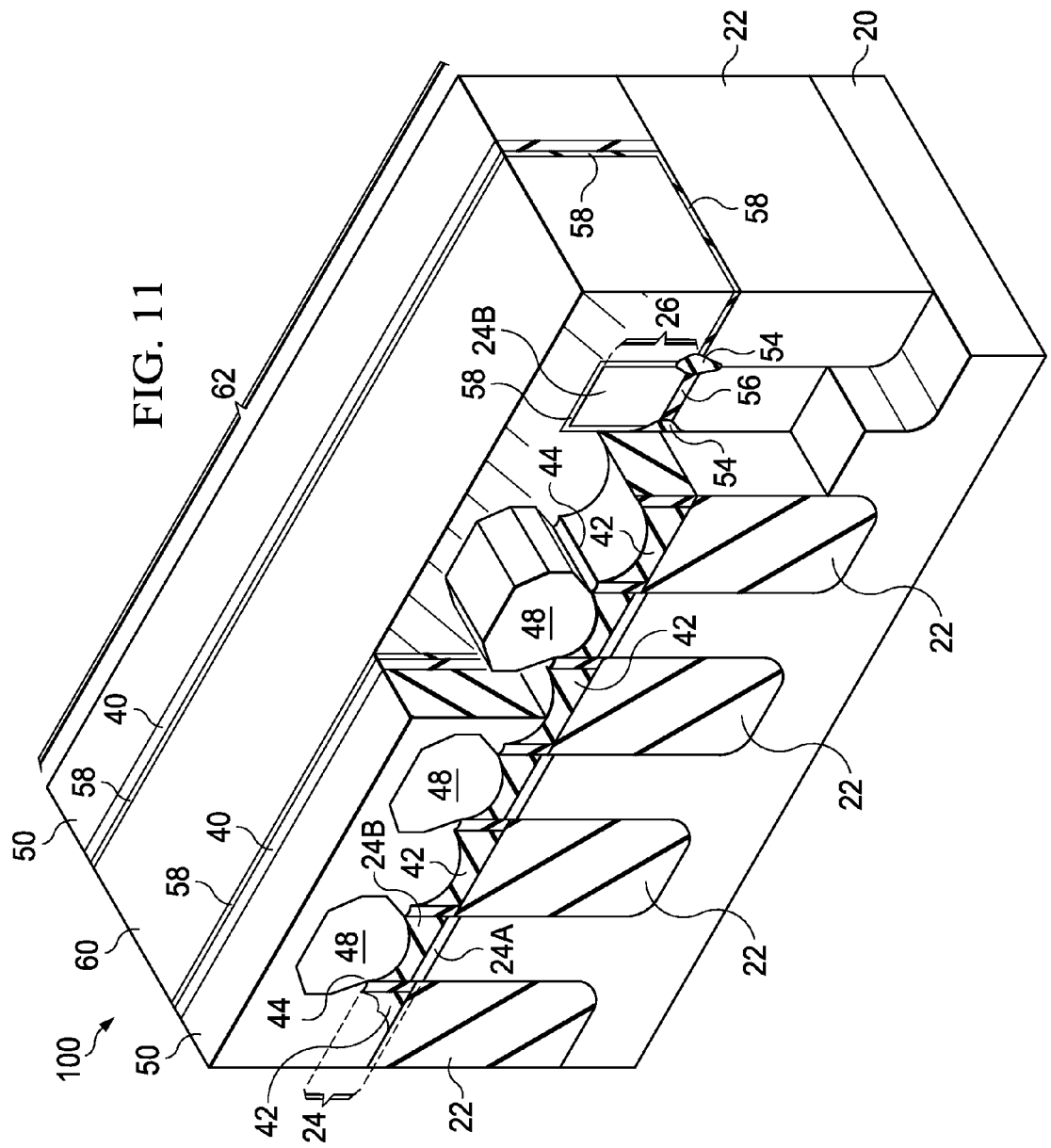

FIG. 11 illustrates the formation of the replacement gate comprising gate dielectric 58 and gate electrode 60. The intermediate stages in the formation of gate dielectric 58 and gate electrode 60 are not illustrated, and are described briefly below referring to FIG. 11. Gate dielectric 58 is then formed as a blanket layer in recess 52 (FIG. 10) and on the top surfaces and the sidewalls of semiconductor fins 26. In accordance with some embodiments, gate dielectric layer 58 comprises silicon oxide, silicon nitride, or multilayers thereof. In alternative embodiments, gate dielectric layer 58 comprises a high-k dielectric material. In which embodiments, gate dielectric layer 58 may have a k value greater than about 7.0, and may include a metal oxide or a silicate of Hf, Al, Zr, La, and the like. Next, conductive material 60 is formed over gate dielectric layer 58, and fills the remaining recess 52 (FIG. 10). Conductive material 60 may comprise a metal-containing material such as TiN, TaN, TaC, Co, Ru, Al, Cu, W, combinations thereof, or multi-layers thereof. After the filling of conductive material 60, a CMP is performed to remove the excess portions of gate dielectric layer 58 and conductive material 60, which excess portions are over the top surface of ILD 50. The resulting remaining portions of conductive material 60 and gate dielectric layer 58 thus form a replacement gate for the resulting FinFET 62.

The embodiments of the present disclosure have some advantageous features. By forming the fin spacers that prevent silicon germanium layer 24A to be exposed in the step (shown in FIG. 7) of etching semiconductor fins 26, silicon germanium layers 24A are protected from being etched. If silicon germanium layers 24A are not protected, silicon germanium layers 24A will be etched more than the overlying layer 24B. A hole will be formed under semiconductor layer 24B, which hole will be later filled (may be partially) by epitaxy regions 48 (FIG. 8). The filled epitaxy region 48 in the hole causes the subsequently formed source/drain regions and gate electrode to be too close to each other, and hence causes the increase in the gate-to-source/drain leakage or the shorting of gate and source/drain.

In addition, the fin spacers prevent the pre-mature lateral expansion of the epitaxy source/drain regions. If the epitaxy source/drain regions are laterally expanded starting from a very low level, some of the laterally expanded source/drain regions may merge long before other source/drain regions merge with each other. The merged source/drain regions have much higher growth rates than the un-merged source/drain regions, resulting in a non-uniform growth in source/drain regions. Hence, the fin spacers are beneficial for the uniform growth of source/drain regions.

In accordance with some embodiments, an integrated circuit device includes a semiconductor substrate, insulation regions extending into the semiconductor substrate, and a semiconductor fin protruding above the insulation regions. The insulation regions include a first portion and a second portion, with the first portion and the second portion on opposite sides of the semiconductor fin. The integrated circuit device further includes a gate stack on a top surface and sidewalls of the semiconductor fin, and a semiconductor region connected to an end of the semiconductor fin. The semiconductor region includes a first semiconductor region formed of a first semiconductor material, wherein the first semiconductor region comprise faceted top surfaces, and a second semiconductor region underlying the first semiconductor region. The second semiconductor region has a higher germanium concentration than the first semiconductor region. A fin spacer is on a sidewall of the second semiconductor region, wherein the fin spacer overlaps a portion of the insulation regions.

In accordance with other embodiments, an integrated circuit device includes a semiconductor substrate, insulation regions extending into the semiconductor substrate, and a FinFET. The FinFET includes a first silicon fin and a second silicon fin over the insulation regions and parallel to each other, a gate stack over a middle portion of the first silicon fin and a middle portion of the second silicon fin, and a first source/drain region and a second source/drain region connected to the first silicon fin and the second silicon fin, respectively. The first source/drain region and the second source/drain region are on a same side of the gate stack. A fin spacer is between the first source/drain region and the second source/drain region, wherein a bottom surface of the fin spacer is in contact with a top surface of the insulation regions.

In accordance with yet other embodiments, a method includes etching a semiconductor substrate to form recesses, and filling the recesses to form STI regions. A portion of the semiconductor substrate between the STI regions forms a semiconductor strip. A top portion of the semiconductor strip is replaced with a first semiconductor layer having a first germanium percentage, and a second semiconductor layer over the first semiconductor layer. The second semiconductor layer has a second germanium percentage lower than the first germanium percentage. The STI regions are recessed, wherein a portion of the semiconductor strip over top surfaces of remaining portions of the STI regions forms a semiconductor fin, with the semiconductor fin comprising the second semiconductor layer. The method further includes forming a gate stack covering a middle portion of the semiconductor fin, forming a gate spacer on a sidewall of the gate stack, forming a fin spacer on a sidewall of an end portion of the semiconductor fin, recessing the end portion of the semiconductor fin, and growing an epitaxy region left by the end portion of the semiconductor fin that is recessed.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit device comprising:
   a semiconductor substrate;
   insulation regions extending into the semiconductor substrate;
   a semiconductor fin protruding above the insulation regions, wherein the insulation regions comprise a first portion and a second portion, with the first portion and the second portion on opposite sides of the semiconductor fin;
   a silicon strip, with opposite edges of the silicon strip contacting sidewalls of the first portion and the second portion of the insulation regions, wherein the semiconductor fin overlaps the silicon strip;
   a gate stack on a top surface and sidewalls of the semiconductor fin;
   a semiconductor region connected to an end of the semiconductor fin, wherein the semiconductor region comprises:
      a first semiconductor region formed of a first semiconductor material, wherein the first semiconductor region comprise faceted top surfaces; and
      a second semiconductor region underlying the first semiconductor region, wherein the second semiconductor region has a higher germanium concentration than the first semiconductor region; and
   a fin spacer on a sidewall of the second semiconductor region, wherein the fin spacer overlaps a portion of the insulation regions.

2. The integrated circuit device of claim 1 further comprising a gate spacer on a sidewall of the gate stack, wherein the gate spacer is connected to the fin spacer.

3. The integrated circuit device of claim 2, wherein the gate spacer is continuously connected to the fin spacer, with no interface therebetween, and wherein the gate spacer and the fin spacer are formed of a same dielectric material.

4. The integrated circuit device of claim 1, wherein the semiconductor fin comprises:
   a top portion; and
   a bottom portion, wherein the bottom portion has a first germanium percentage higher than a second germanium percentage of the top portion.

5. The integrated circuit device of claim 4, wherein a width of the bottom portion of the semiconductor fin is smaller than a width of the top portion of the semiconductor fin.

6. The integrated circuit device of claim 1, wherein the fin spacer overlaps the first portion of the insulation regions, with the fin spacer and the insulation regions comprising different dielectric materials.

7. The integrated circuit device of claim 1, wherein the first semiconductor material comprises an epitaxial material, whererin the second semiconductor region comprises a first epitaxial layer underlying a second epitaxial layer.

8. The integrated circuit device of claim 7, wherein the first epitaxial layer has a higher germanium concentration than the second epitaxial layer.

9. The integrated circuit device of claim 7, wherein the fin spacer comprises an edge contacting the sidewall of the second semiconductor region, and wherein a top end of the edge extends further away from the substrate than a top surface of the second epitaxial layer.

10. An integrated circuit device comprising:
    a semiconductor substrate;
    insulation regions extending into the semiconductor substrate; and
    a Fin Field-Effect Transistor (FinFET) comprising:
       a first silicon fin and a second silicon fin over the insulation regions and parallel to each other;
       a gate stack over a middle portion of the first silicon fin and a middle portion of the second silicon fin;
       a first source/drain region and a second source/drain region connected to the first silicon fin and the second silicon fin, respectively, wherein the first source/drain region and the second source/drain region are on a same side of the gate stack;
       a fin spacer between the first source/drain region and the second source/drain region, wherein a bottom surface of the fin spacer is in contact with a top surface of the insulation regions;
       a germanium-containing region overlapped by the first silicon fin; and
       a silicon strip overlapped by the first silicon fin and the germanium-containing region, wherein opposite sidewalls of the silicon strip are in contact with sidewalls of the insulation regions.

11. The integrated circuit device of claim 10, wherein the insulation regions comprise an oxide, and the fin spacer comprises a nitride in physical contact with the oxide.

12. The integrated circuit device of claim 10, wherein the fin spacer comprises a first edge and a second edge contacting the first source/drain region and the second source/drain region, respectively, and wherein thicknesses of edge portions of the fin spacer are greater than a thickness of a center portion of the fin spacer.

13. The integrated circuit device of claim 12, wherein the first source/drain region comprises a second epitaxial layer overlying a first epitaxial layer, and wherein a top end of the first edge of the fin spacer is further away from the substrate than a top surface of the second epitaxial layer of the first source/drain region.

14. The integrated circuit device of claim 10 further comprising a gate spacer on a sidewall of the gate stack, wherein the gate spacer is connected to the fin spacer.

15. The integrated circuit device of claim 14, wherein the gate spacer is continuously connected to the fin spacer, with no interface therebetween, and wherein the gate spacer and the fin spacer are formed of a same dielectric material.

16. The integrated circuit device of claim 10 further comprising:
 silicon oxide regions on opposite sides of, and in contact with, the germanium-containing region.

17. An integrated circuit device comprising:
 a semiconductor substrate;
 insulation regions extending into the semiconductor substrate;
 a gate stack over the insulation regions;
 a semiconductor region between two portions of the insulation regions, wherein the semiconductor region comprises:
  a middle portion covered by the gate stack, wherein the middle portion comprises a first silicon germanium portion and a silicon portion overlapping the first silicon germanium portion; and
  an end portion not covered by the gate stack, wherein the end portion is connected to the middle portion, and comprises a second silicon germanium portion and a silicon phosphorous portion overlapping the second silicon germanium portion, wherein the first silicon germanium portion has a germanium percentage higher than a germanium percentage of the second silicon germanium portion; and
 silicon oxide regions on opposite sides of the first silicon germanium portion, wherein the silicon oxide regions have portions overlapped by the silicon portion of the middle portion.

18. The integrated circuit device of claim 17, wherein the first silicon germanium portion is coplanar with at least a middle portion of the second silicon germanium portion.

19. The integrated circuit device of claim 17 further comprising a fin spacer over the insulation regions and contacting a sidewall of the second silicon germanium portion.

20. The integrated circuit device of claim 17, wherein the first silicon germanium portion forms a channel of a Fin Field-Effect Transistor (FinFET), and the second silicon germanium portion forms a source/drain region of the FinFET.

21. The integrated circuit device of claim 17, wherein the first silicon germanium portion is narrower than the second silicon germanium portion.

\* \* \* \* \*